United States Patent
Cutcher, Sr.

[11] Patent Number: 6,073,554
[45] Date of Patent: Jun. 13, 2000

[54] INK SHIELD SCREEN PRINTING ASSEMBLY AND PROCESS

[76] Inventor: Thomas V. Cutcher, Sr., 5045 Summerfield Rd., Petersburg, Mich. 49270

[21] Appl. No.: 09/023,499

[22] Filed: Feb. 13, 1998

[51] Int. Cl.[7] .............................. B10S 17/06; B10S 17/08
[52] U.S. Cl. ........................................ 101/127; 101/127.1
[58] Field of Search ................................ 101/127, 127.1, 101/129, 126

[56] References Cited

U.S. PATENT DOCUMENTS

| | | | |
|---|---|---|---|
| 3,851,581 | 12/1974 | Baum et al. | 101/129 |
| 3,852,564 | 12/1974 | Baum et al. | 101/127 |
| 4,379,737 | 4/1983 | Mearing | 205/75 |
| 4,485,736 | 12/1984 | Struntz, Jr. et al. | 101/129 |
| 4,519,760 | 5/1985 | Norell | 425/113 |
| 4,620,787 | 11/1986 | Black et al. | 355/76 |
| 4,638,733 | 1/1987 | Schneider et al. | 101/114 |
| 4,779,529 | 10/1988 | Ericsson | 101/123 |
| 4,791,006 | 12/1988 | Galvogni et al. | 101/127 |
| 4,841,854 | 6/1989 | Bubley | 101/123 |
| 4,958,560 | 9/1990 | Collins | 101/128.1 |
| 4,989,512 | 2/1991 | Lindström et al. | 101/123 |
| 5,003,870 | 4/1991 | Isaak | 101/127.1 |
| 5,078,063 | 1/1992 | Johansen et al. | 101/480 |
| 5,388,509 | 2/1995 | Cutcher | 101/128.1 |
| 5,390,595 | 2/1995 | Cutcher | 101/128.1 |
| 5,447,757 | 9/1995 | Cairncross et al. | 427/510 |
| 5,596,925 | 1/1997 | Hasegawa | 101/127.1 |
| 5,743,182 | 4/1998 | Kobayashi et al. | 101/129 |

*Primary Examiner*—John S. Hilten
*Assistant Examiner*—Daniel J. Colilla
*Attorney, Agent, or Firm*—Marshall & Melhorn

[57] ABSTRACT

A printing screen assembly is provided with an integral shield to protect the ink which is dispensed on the top surface of the screen during the printing process. The mesh material is mounted on a frame member and coated with exposed emulsion with open areas for transferring ink to a glass substrate. A shield is mounted on a second frame member and positioned on the first frame member so that the shield is placed in parallel spaced-apart relationship with the mesh material. The frame members, the mesh material and the shield form an enclosed ink containment area to protect the ink from contamination during the printing process. For water-based ink, water vapor can be added to the containment area to maintain the ink at the desired relative humidity. An ink dispensing strip fits in the containment area between the shield and the mesh fabric of the screen. The shield must have sufficient elasticity such that the forces of the flood bar and squeegee of the printing press are transmitted to the ink and the mesh material of the screen. The process of manufacturing the printing screen assembly includes the step of forming the printing screen and the shield on two separate frame members.

14 Claims, 5 Drawing Sheets

INK SHIELD SCREEN PRINTING ASSEMBLY AND PROCESS

BACKGROUND OF THE INVENTION

1. Field of the Invention

The invention relates to a novel printing screen assembly having a shield formed by a flexible, nonporous sheet of material mounted on the frame of the screen assembly and positioned parallel to the mesh screen to form an enclosed ink containment area. The invention further relates to a method for making such a printing screen assembly and a process of screen printing on hard non-absorbent materials, such as glass.

2. Summary of Related Art

Screen printing is an important process in making automotive glass and other glass components, for making printed circuit boards, and for a number of other applications where a specific pattern is printed on a hard substrate surface. In the glass manufacturing process, screen printing is used to print shaded bands around the edges of the window glass and to print the electrically conducting networks for heater arrays on back lights. Screen printing presses are also used for package printing applications. Presses print on both flat and curved surfaces and are used in a variety of industries.

In the various manual and automatic screen printing apparatus, a flood bar and a squeegee blade are mounted on a carriage in the printing press. The press includes a control system to control both vertical and horizontal motion of the squeegee blade assembly and the carriage. A screen with the desired pattern is placed in contact with the object being printed, and the ink or paint is placed on top of the screen. The flood bar is used to distribute ink across the screen in a first pass over the screen. The flood bar is raised and the squeegee blade is lowered and drawn across the screen to force the ink through the screen onto the workpiece to be printed upon in a pattern determined by art work formed on the screen. Ink is forced through any openings in the emulsion coating on the screen such that ink is deposited on the glass or other solid substrate adjacent the openings in the screen.

In some presses, the drive carriage will include only a single squeegee blade. The squeegee blade is pressed across the screen in one direction to force ink through the screen in any of the apertures in the screen coating. A return run of the squeegee blade back across the screen forces the ink onto the surface of the workpiece.

In order to achieve pressure on the working edges of the squeegee on a screen, without ripping the screen, the elasticity of the rubber material in the squeegee blade is utilized. The elastic rubber material of the squeegee blade extending from the face plates develops an even pressure over the entire length of the working edge during the printing process.

Various printing screens structures and manufacturing methods are known in the art. The typical printing screen for automotive glass starts by preparing the original pattern as a positive film, and then transferring the positive image on a positive film to a full-size photosensitive transparency. A screen is prepared by coating the screen with a photosensitive emulsion and placing the transparency on the screen. A light source on the transparency side of the screen is switched on for the required exposure time. The screen is separated from the transparency and the non-exposed areas of emulsion are washed away to form the desired pattern in the screen.

The thickness of the layer of ink which is deposited on the glass or other substrate depends on a number of factors, including size of the mesh in the screen, the type of ink or paint, the thickness of the hardened emulsion formed in the screen, the pattern of the emulsion in the deposit areas, and other similar factors. The thickness of the emulsion depends on the thickness of wet emulsion applied to the screen and the photo cure time to harden the emulsion. In many cases, the emulsion must be applied in several steps to harden the emulsion to the desired thickness.

Once the screen is formed, the screen is mounted in the printing press for production use. In automotive glass applications, a single screen can be used to print several thousand pieces of glass. The screens are replaced on a regular basis and production quality is monitored to detect defects caused by screen problems such as a tear in the screen, deterioration of the emulsion, or clogging of the mesh openings of the screen.

One of the problems encountered in the manufacture of automotive glass and in other printing processes used in production operations is contamination of the paint. In most applications, the ink is exposed to the production environment about the printing press such that dust, dirt, glass chips, and other contaminants may settle in the paint. Contaminants in the ink may block openings in the screen such that the ink does not pass through the screen and the printing on the glass does not meet acceptable quality standards.

The contamination of ink has recently become a greater concern due to changes in the type of ink used in production. In automotive glass applications, the ceramic ink (paint) used for the obscuration band printing had typically been a lead based ink. Because of the documented environmental problems with lead ink and lead paint, glass manufacturers are using water-based inks which do not contain lead. The water-based inks are not as opaque as the lead inks. Consequently, more water-based ink must be applied to the glass to provide the desirable obscuration band. In order to achieve a heavier deposit of water-based ink, thicker mesh fabric has been used on the obscuration bands.

Problems have occurred with the use of water-based ink in the printing process with the clogging of the mesh openings in the screen. The water-based ink, which is exposed to ambient conditions on top of the screen, is sensitive to the temperature and humidity in the production environment. The optimum operating conditions occur when the temperature and humidity are maintained within a specific range. Ink will thicken and clog the openings in the screen at a low temperature, but low temperatures are not usually a problem in production applications. At high temperatures or low humidity, evaporation is a problem with the water-based ink such that the ink will block openings in the screen. The ink cures and hardens in the mesh of the screen to block opening and prevent ink from passing through the mesh to the glass substrate.

Keeping contaminants out of the ink reduces the undesirable clogging of the mesh openings in the screen. Maintaining the water-based ink in a humid atmosphere is also desirable when using the ink in a printing process. The water-based ink maintains the desired viscosity and passes through the mesh openings in the screen. Relative humidities in the range of 80%–100% are preferred for water-based inks.

A number of U.S. patents have disclosed various screen assemblies used for production operations such as automotive glass production. U.S. Pat. Nos. 3,851,581 and 3,852,564 to Baum et al disclose a method of making a silk screen and the manufacture of electrically heated windows. The references teach a screen having a uniform thickness and that the uniform thickness may be varied by depositing successive layers of emulsion.

U.S. Pat. No. 4,958,560 to Collins teaches a method of screen printing a patterned ink layer using a screen with a patterned coating on its surface facing the substrate. The reference discloses that the thickness of a patterned ink layer screen printed on a glass surface can be increased in selected areas by providing a pattern of emulsion dots for local support between the screen surface and the glass in the selected areas. U.S. Pat. No. 4,379,737 to Mearig and U.S. Pat. No. 4,791,006 to Galvagni et al disclose additional screen assemblies and methods for providing variable thickness ink build up.

A printing screen configuration and method for printing a variable thickness pattern are disclosed in U.S. Pat. Nos. 5,388,509 and 5,390,595 issued to applicant. A screen is formed by applying a first coat of emulsion to the mesh material of the screen to define open areas. A second coat of emulsion of different thickness is applied to the screen, the second layer being in the form of a dot pattern. The difference of thickness in the emulsion dot pattern produces a thicker pattern of ink during the screen printing process.

Screen assemblies and printing processes are also disclosed in a number of U.S. patents relating to squeegee holder assemblies and printing presses. U.S. Pat No. 5,078,063 to Johansen et al. discloses a squeegee holder with a levelness control and a pressure control for the squeegee blade.

An alternative squeegee arrangement is shown in U.S. Pat. No. 4,989,512 to Lindstrom et al. The squeegee is maintained at an angle and includes a plurality of defined support positions. U.S. Pat. No. 4,841,854 to Bubley shows a squeegee assembly with two face plates and a center bar.

U.S. Pat. No. 4,779,529 to Ericsson discloses a squeegee system which maintains the squeegee blade at an obtuse or an acute angle, irrespective of the direction of relative squeegee movement. A plurality of independent squeegee holder members are shown in U.S. Pat. No. 4,638,733 to Schneider et al. The screen assemblies disclosed in the prior art provide for a layer of ink disposed on the screen and direct contact between the squeegee and the ink.

In order to control the environment of the ink to prevent contamination and maintain the desired humidity, one option is to build a "clean room" type of enclosure around the printing press in the production area. The enclosure is expensive to build and maintain. Placing the printing press in an enclosure may adversely effect operator access to the printing area for production operations, troubleshooting, and routine maintenance.

A significant problem in using a clean room type enclosure for the printing operations is maintaining a higher humidity in the enclosure to ensure the desired results in transferring the ink through the open mesh areas of the screen. When moisture is added to the atmosphere in the enclosure to maintain a high relative humidity, the additional moisture in the enclosure has an adverse effect on the equipment in the enclosure. At a relative humidity of near 100%, moisture will form on the printing press, the conveyors, and other equipment in the enclosure. Such equipment is not typically designed for operation in a high moisture environment, such that the moisture will cause deterioration problems with both the electrical components and the mechanical components in the enclosure.

In addition, moisture forms on the glass substrate and the screen such that the screen sticks to the glass during production operations. The sticking problem often causes delays in, or even a shut down of, the production line.

Automotive glass manufactures and other users of screen assemblies for printing processes in production operations have a need for a low cost and convenient means for preventing contamination of the ink and for maintaining water-based inks in a moist environment. The preferred screen assembly would be usable on the existing printing press without modifying the equipment, the building, or the process used to print the glass.

SUMMARY OF THE INVENTION

In accordance with the present invention, there is provided a printing screen assembly having a shield to protect and enclose the ink during the printing process. In order to achieve the desired transfer of ink through the screen to the glass substrate, ink is placed on the top surface of the screen and is forced through open areas in the mesh by the movement of the squeegee to form the desired ink pattern on the glass surface. Instead of having the squeegee in direct contact with the ink on the top surface of the screen, an elastic shield is mounted on a second frame member and positioned on the first frame member so that the shield is positioned in parallel spaced-apart relationship with the mesh material. The frame members, the mesh material and the shield form an enclosed ink containment area to protect the ink from contamination during the printing process. For water-based ink, the shield also helps to retain the moisture in the ink.

The shield must be spaced at the proper distance from the screen to allow sufficient ink to be spread across the top surface of the screen in the containment area. In addition, the shield must have sufficient elasticity such that the forces caused by the action of the flood bar and squeegee of the printing press are transferred through the shield to the ink for transferring ink through the open mesh areas of the screen. The shield may be formed by an elastic sheet of plastic or neoprene rubber material.

Another material which provides favorable results is a mesh screen with a solid layer of emulsion. Material with a fine mesh provides the desired elasticity. The emulsion material can be the same emulsion which is used on the mesh fabric of the screen. Since the ink and emulsion are tested for compatibility and performance, the use of the same emulsion for the shield will also typically provide acceptable results. Another advantage in using the mesh fabric to form the shield is that the warp and the weft can be secured with two different tensions. The tension for the warp and the weft can be independently adjusted on the frame to provide the desired flexibility and tension for the shield.

During the printing process in a continuous production operation, the supply of ink in the containment area must be replenished on a regular basis. While the shield makes supplying ink more difficult, there are a several different configurations for dispensing ink in the containment area. An ink dispensing strip can fit in the containment area between the shield and the mesh fabric of the screen. Ink is stored and filtered in a storage drum near the screen and delivered as needed through one or more supply tubes. The pressure from the dispensing system forces the ink out of the dispensing strip and into the containment area. Access to the strip may be provided by holes in the screen or in the frame members. In addition, the frame members may be spaced apart at one end to allow for insertion of the supply tubes or the use of alternative delivery fixtures.

The operation of the flood bar and the squeegee do not have to be changed for operation with a shield on the printing screen assembly. The flood bar contacts the shield and moves across the shield to spread the ink in the containment area. The squeegee moves in the opposite direction across the shield to force ink from the containment area through the open mesh areas of the screen to the glass. The smooth surface of the shield will generally provide an even wear pattern on the squeegee as opposed to an uneven wear pattern when the squeegee directly engages the mesh screen with hardened emulsion edges around the openings in the screen. The more even wear pattern squeegee results in longer life for the squeegee, which reduces operating costs. In order to facilitate the sliding of the flood bar and squeegee across the shield, a lubricant may be placed on the outer surface of the shield. The lubricant will further increase the production life of the shield and the production life of the squeegee.

To prevent accumulation of the ink along the edges of the frame during the printing process, containment strips may by positioned in the containment area along the sides of the frame. The containment strips help to maintain the ink over the mesh openings in the screen and prevent undesirable build up of ink along the side edges of the frame. The containment strips are typically made from a flexible foam or plastic material.

The clogging of the screen and other problems with water-based inks can be reduced by maintaining the atmosphere around the ink at a desired relative humidity. The humidity can be maintained within the desired range by selectively adding water vapor to the containment area between the mesh material and the shield. In some cases, merely enclosing the ink in the containment area will improve the water retention of the ink and provide the desired environment for the water-based ink. When the relative humidity is low, water vapor and/or an inert gas may be delivered to the containment area to increase the relative humidity and improve the performance characteristics of the ink. The inert gas does not adversely impact the performance of the ink used in the printing process.

To manufacture the printing screen assembly, the mesh material is secured on a first frame member. The mesh is formed with a layer of exposed emulsion and open areas. Once the open areas for passing of ink through the mesh material are defined, the second frame member can be installed. The plastic sheet or mesh material is fastened to the second frame member. If mesh material is being used, a solid layer of exposed emulsion is formed across the entire mesh material. The first frame member has a spacing flange or other means for securing the second frame member to the first frame member such that the two sheets of material and the frames form a containment area for the ink.

The printing screen of the assembly of the present invention can be mounted in the printing press in the same manner as a standard screen with a single layer of mesh material. The ink dispensing strip or other ink delivery system is placed in the containment area prior to the joining of the two frame members. The ink is delivered to the containment area, and the flood bar and the squeegee of the printing press are ready to begin the repetitive production operation for printing a pattern on glass or other solid substrate. Water vapor and/or an inert gas may also be delivered as needed to the containment area to maintain the desired relative humidity.

BRIEF DESCRIPTION OF THE DRAWINGS

The above, as well as other advantages of the present invention, will become readily apparent to those skilled in the art from the following detailed description of a preferred embodiment when considered in the light of the accompanying drawings in which.

DESCRIPTION OF THE PREFERRED EMBODIMENT

Figure 1:
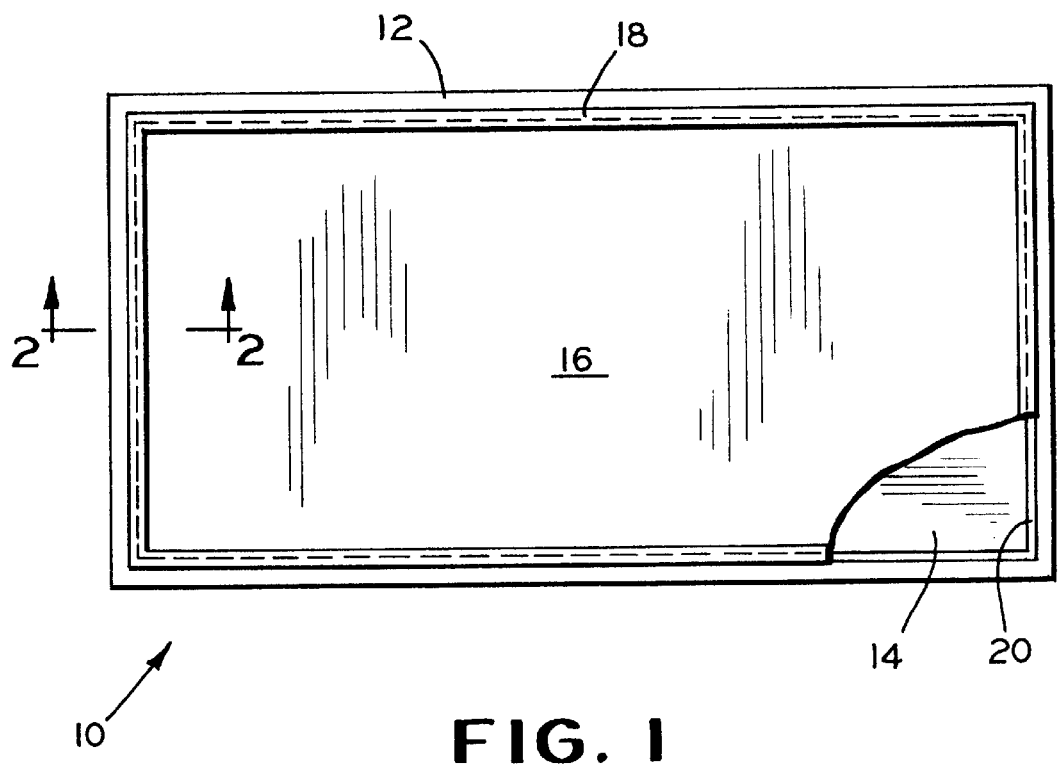
FIG. 1 is a top plan view of the printing screen assembly of the present invention showing the outer frame, the inner frame, and the shield mounted on the inner frame.

Referring now to the drawings, there is illustrated in diagrammatic fashion a printing screen assembly and a method of forming and using the printing screen assembly to provide a containment area in the assembly to protect the ink and improve the printing process. As will be evident to those skilled in the art, the mesh size of the screen, the exposed layers of emulsion, and the open areas in the mesh have been enlarged and simplified for purposes of illustration.

Figure 2:
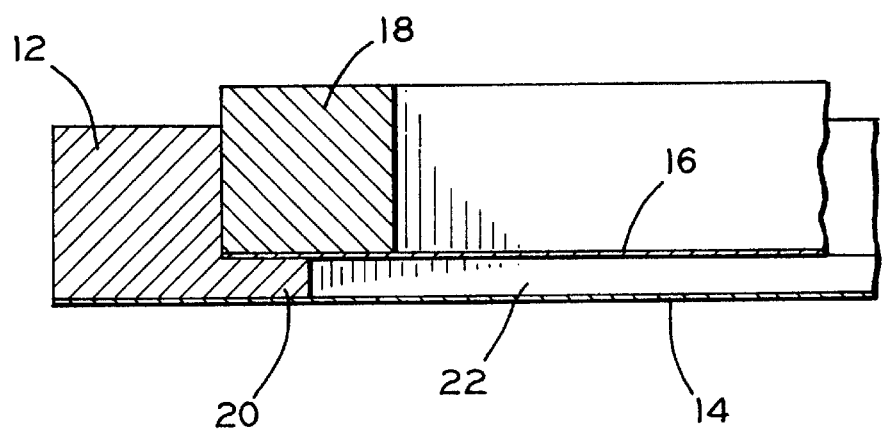
FIG. 2. is a cross sectional view of the printing screen frames taken along line 2—2 illustrating the positioning of the frames and the containment area between the screen and the shield.

The printing screen assembly 10 of the present invention is shown in FIGS. 1–2. The main components of the assembly 10 include the outer frame member 12 and the mesh fabric screen 14 which is stretched and mounted on the frame member 12. A typical screen assembly includes these two components. In addition, the assembly 10 includes a shield 16 mounted on a frame member 18. The frame members 12, 18 are typically metal frames made from aluminum, aluminum tubing, or other similar metal.

The outer frame member 12 includes a flange or spacer 20 extending from the body of the frame 12. The spacer 20 supports the inner frame member 18 such that the shield 16 and the screen 14 are maintained in spaced-apart relationship. The screen 14, shield 16 and spacer 20 form a containment area 22 for positioning the ink 24 in a protected environment on the top surface of the screen 14. The spacer 20 may extend around the inner circumference of the frame 12, although such total support is not necessary. Segments of the spacer 20 may be omitted so long as the spacer segments which are formed on the frame member 12 are sufficient to support the inner frame 18.

The two frame members 12, 18 are sized so that the frames nest together. The tight fit of the two frame members 12, 18 eliminates the need for clamps or other means to secure the two members together. The fit between the frame members 12, 18 also virtually eliminates any sliding action of the inner frame member 18 when the outer frame member 12 is mounted on the printing press. The frame members 12, 18 can be built, stored and transported to the production area as a unit or as individual components. In general, the screen 14 will deteriorate and require placement sooner than the shield 16. With the frame members of the present invention, the shield 16 and inner frame member 18 can be used with more than one screen 14.

Other frame configurations may be used to form the containment area 22 between the screen 14 and the shield 16. The frame may be formed from a single member for mounting both the screen 14 and the shield 16. The frame members 12 and 18 may have different configurations which are clamped together or which have interlocking components to provide a sturdy overall frame with the desired containment area.

Figure 3:
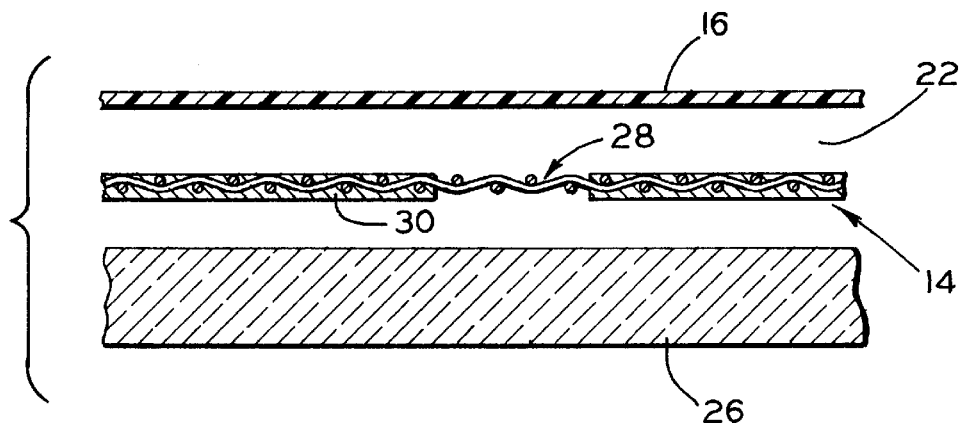
FIG. 3 is an enlarged cross sectional view of the printing screen assembly mounted for printing on a sheet of glass and an open mesh area of the screen through which ink is deposited.

The screen 14 is formed by a mesh fabric, as shown in FIG. 3. A number of fabrics may be used, such as 160 mesh, white monofilament polyester mesh. The 160 mesh fabric has a threaded diameter of 0.002 inches and a mesh opening of 0.004 inches by 0.004 inches. The required pattern on the glass or other hard substrate 26 is formed by forcing ink 24 through openings 28 in the mesh fabric. The openings 28 in the mesh fabric of the screen 14 are defined by a photosensitive coating of emulsion 30 on the mesh fabric of the screen 14.

The original art work pattern is produced and formed as a positive film pattern on an art work transparencies. The film pattern is formed on transparencies for use in forming the printing screen 14. After the fabric of the screen 14 is mounted in the frame 12, the screen 14 is coated with a photosensitive emulsion 30, such as "Majestech Universol Plus" or "Autosol Plus". The emulsion 30 is dried and the art work transparency with is placed against the emulsion 30 on the fabric of the screen 14. A light source is then placed adjacent to the transparency and the emulsion 30 is exposed to the light for the necessary time to properly harden the emulsion 30 on the screen 14 which was exposed to the light source. The transparency is removed from the screen 14 and the fabric of the screen 14 is washed to dissolve the unexposed areas of the emulsion. The film pattern prevents light from reaching the emulsion 30 and forms the unexposed areas which are washed away to form the mesh openings 28 in the screen 14.

Figure 4:
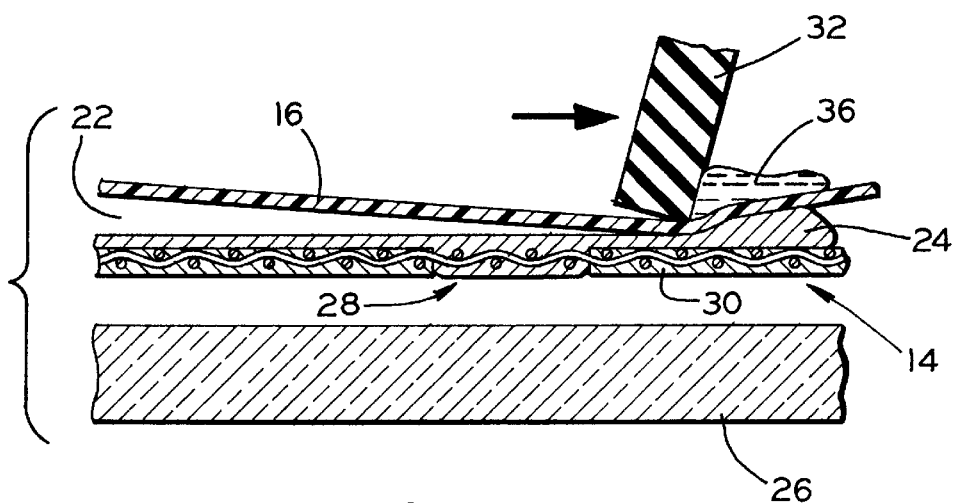
FIG. 4 is an enlarged cross sectional view showing the flood bar moving across the shield to distribute ink through the containment area.
Figure 5:
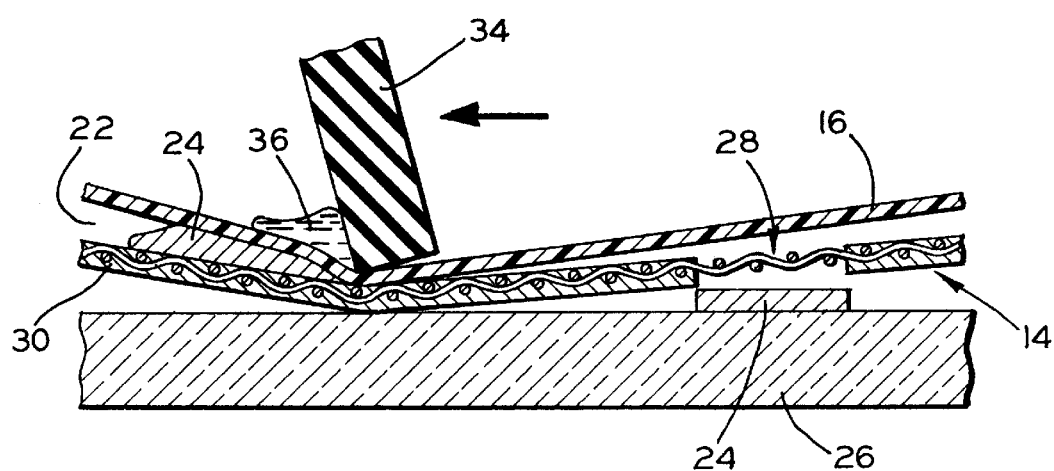
FIG. 5 is an enlarged cross sectional view showing the squeegee moving across the shield to force ink through the open mesh areas of the screen and onto the glass.

As shown in FIGS. 4–5, the ink 24 is forced onto the glass substrate 26 through the mesh openings 28 in the screen 14 during the printing process. The carriage of the printing press (not shown) includes a clamping mechanism to secure a flood bar 32 and a squeegee 34. The carriage of the printing press is used to position and move the flood bar 32 and squeegee 34 across the shield 16 of the screen assembly 10 when the assembly 10 is mounted on the press. The screen 14 is placed in contact with the glass substrate 26, and the ink 24 is placed in the containment area 22. The flood bar 32 is used to distribute ink 24 through the containment area 22 and across the screen 14 in a first pass over the shield 16 of the screen assembly 10. The flood bar 32 is raised and the squeegee blade 34 is lowered and drawn across the shield 16 of the screen assembly 10 to force the ink 24 through the screen 14 onto the glass substrate 26. Ink 24 is forced through the openings 28 in the emulsion coating 30 on the screen 14 such that ink 24 is deposited on the glass substrate 26 adjacent the openings 28.

In some presses, the drive carriage will include only a single squeegee blade. The squeegee blade is pressed across the screen in one direction to force ink through the screen in any of the apertures in the screen coating. A return run of the squeegee blade back across the screen forces the ink onto the surface of the workpiece.

The blade of the squeegee 34 is made of hard rubber or other elastic material which presents a sharp edge to the surface of the shield 16 throughout the travel of the squeegee 34 during a printing stroke. The elastic blade of the squeegee 34 is deflected as a result of the blade resilience, the downward pressure on the squeegee 34, and the frictional engagement of the leading edge of the squeegee 34 with the shield 16 during a printing stroke. Since the shield 16 is a smooth surface, as opposed to a screen surface with hardened emulsion edges around openings in a regular screen assembly, the squeegee 34 in the present application requires less frequent servicing and/or replacement.

The forces of the flood bar 32 and the squeegee 34 are transferred through the shield 16 to the ink 24 in the containment area 22. The printing on the substrate 26 is achieved by the combination of providing ink 24 in the containment area 22 and by transmitting force from the squeegee 34 through the shield 16 to cause the desired amount of ink 24 to be forced through the mesh openings 28 onto the glass substrate 26. Consequently, the shield 16 must have sufficient elasticity for extending the shield 16 to exert pressure on the ink 24 when the shield 16 is engaged by the squeegee 34. The elasticity of the shield 16 also results in the shield 16 returning to its original, planar configuration to permit more ink to be dispensed into the containment area 22.

The shield 16 can be made from an elastic plastic sheet or from neoprene rubber. An alternative material for constructing the shield 16 is a mesh fabric which is coated with emulsion. The mesh fabric is coated with emulsion over the entire surface such that no openings in the mesh are formed. No art work is required and the total area of the fabric is exposed to the light source to form a solid shield of exposed emulsion. The mesh fabric of the shield 16 has sufficient elasticity to permit the transfer of force from the squeegee 34 to the ink 24 in the containment area 22. The same type of emulsion, which is compatible with the ink 24 being used in the printing process, can be used on both the screen 14 and the shield 16. Maintaining a constant tension on the shield 16 is not critical. The loss of some of the tension in a shield 16 made from mesh fabric is not detrimental so long as the flood bar 32 and squeegee 34 can spread the ink 24 in the containment area 22 and force the ink 24 through the mesh openings 28 of the screen 14. In addition, the tension of the warp and the tension of the weft for the mesh fabric can be adjusted independently of each other. The mesh fabric of the shield 16 can be mounted on the frame 18 with asymmetric tension such that the tension is relatively low in one direction and high in the other direction. The asymmetric tension provides the desired flexibility to the shield 16.

An area of concern in using the printing screen assembly 10 of the present invention is the undue wear and tear caused by the friction between the shield 16 and the squeegee 34 during printing operations. A lubricant 36 may be placed on the outer surface of the shield 16 to significantly reduce the friction between the shield 16 and the flood bar 32 and squeegee 34. The lubricant 36 facilitates the lateral movement of the flood bar 32 and squeegee 34 without adversely effecting the vertical force applied to the ink 24 in the containment area 22.

The shield 16 protects the ink 24 in the containment area 22 from contaminants near the printing screen assembly 10 during production operations. The containment area 22 also prevents water evaporation from a water-based ink 24. Since the ink 24 is enclosed in the containment area 22, the water does not evaporate from the ink 24 and the desired moisture content of the ink is maintained. If the ink 24 is exposed to the atmosphere, the preferred range for the relative humidity is in the range of 80–100%. In dry atmospheric conditions, it may be desirable to add water vapor or an inert gas to the containment area 22 to help the ink 22 in the desired condition. Maintaining the ink 24 at a specific relative humidity range keeps the ink 24 at the same consistency, which reduces the problems caused by clogging of the mesh openings 28. More reliable and consistent printing results can be achieved by maintaining the relative humidity about the ink 24 within a specified range.

Since the upper surface of the screen 14 is covered by the shield 16, a system must be provided to supply ink 24 to the containment area 22 during the printing operations. In addition, the printing screen assembly 10 can be provided with a system for delivering water vapor for humidity control in the containment area 22. Because the frame includes two separate frame members 12, 18, one method for placing ink 24 in the containment area 22 is to manually lift the inner frame 18 to open the containment area 22, dispense ink 24 onto the top surface of the screen 14, and return the inner frame 18 to its position within the other frame member 12 SO as to close up the containment area 22. Although such a manual system for dispensing the ink 24 might be acceptable for a low volume operation, the preferred method of dispensing ink to the containment area 22 is to provide an automatic system for dispensing the ink 24.

In order to a continuous supply of ink 24 to the containment area 22, an ink source 38 is typically positioned in proximity to the printing press. The ink 24 is supplied to the containment area 22 from the ink source 38 which consists of a two part reservoir. The ink source 38 includes a storage reservoir 40 where ink is stored in bulk. The ink 24 is then forced through a filter 42 to remove any contaminants in the ink 24 which could clog the mesh openings 28 in the screen 14. The filtered ink 24 is stored in a second reservoir 44 and is pumped to the containment area 22. The ink source 38 with pumping system is known in the art and has been used in the industry to deliver ink 24 to the upper surface of the screen 14.

In screens without a shield, the delivery of ink is not a problem in that the ink is typically dispensed at one end of the screen and moved by the flood bar 32 across the screen. In the present printing screen assembly 10, the shield 16 blocks delivery of ink 24 to the upper surface of the screen 14. Various devices can be positioned in the containment area 22 and connected to the ink source 38. A strip dispenser 46 is positioned at one end of the containment area 22 as shown in FIGS. 6–10. The strip dispenser 46 is a thin, tubular device which fits between the screen 14 and the shield 16. The dispenser 46 has one or more intake ports 48 for receiving ink 24 through delivery tube 50 from the ink reservoir 44. The strip dispenser 46 has openings along one edge such that the force of the ink 24 being pumped from the reservoir 44 discharges the ink 24 from the strip dispenser 46 into the containment area 22 on the surface of the screen 14. The pumping force and the cycle time of the pumping system are controlled to ensure that the proper quantity of ink 24 is maintained in the containment area 22.

Figure 6:
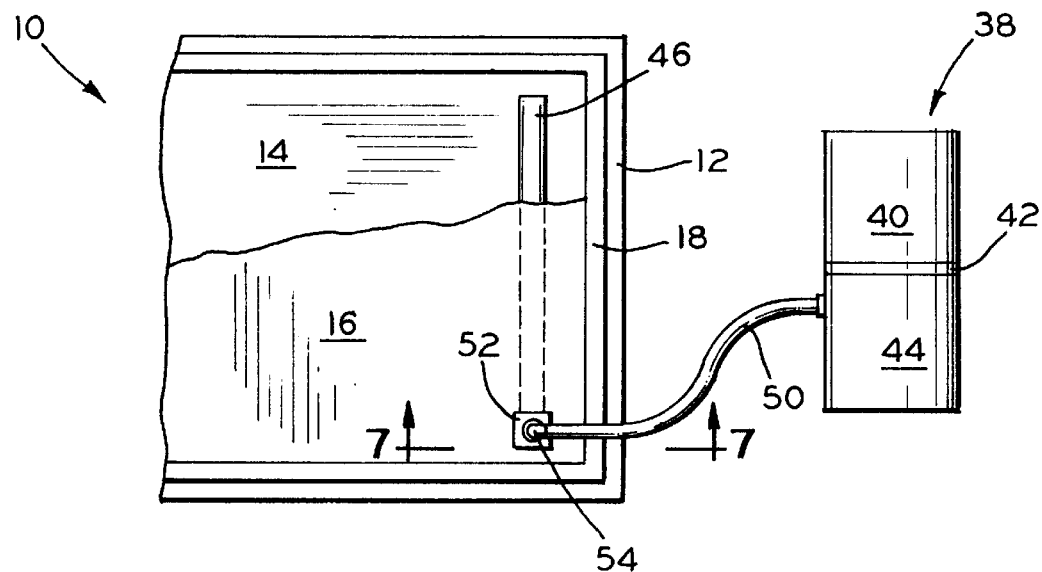
FIG. 6 is a top plan view of a segment of the printing screen assembly with part of the shield broken away to show the ink dispenser strip connected to an ink supply and mounted in the containment area between the shield and the screen.
Figure 7:
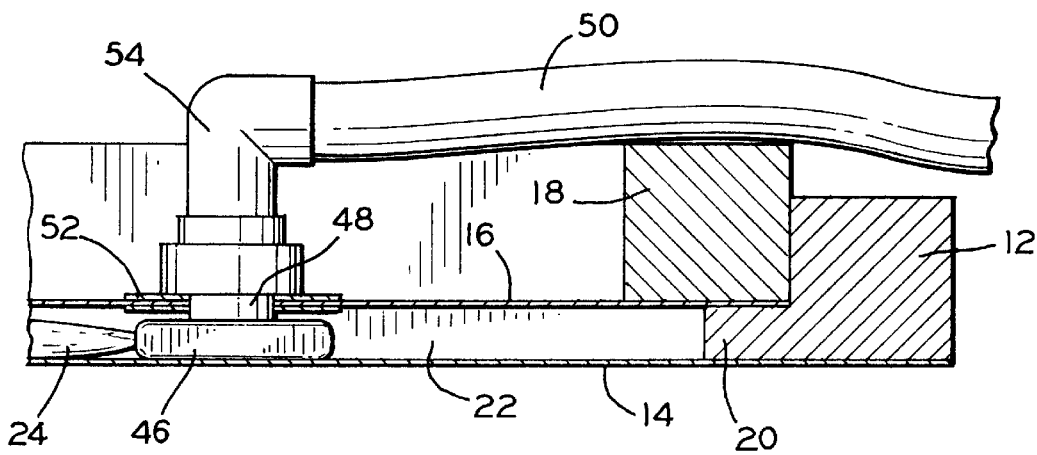
FIG. 7 is a cross sectional view taken along line 7—7 of FIG. 6 illustrating the ink dispenser strip and a fitting extending through the shield.
Figure 8:
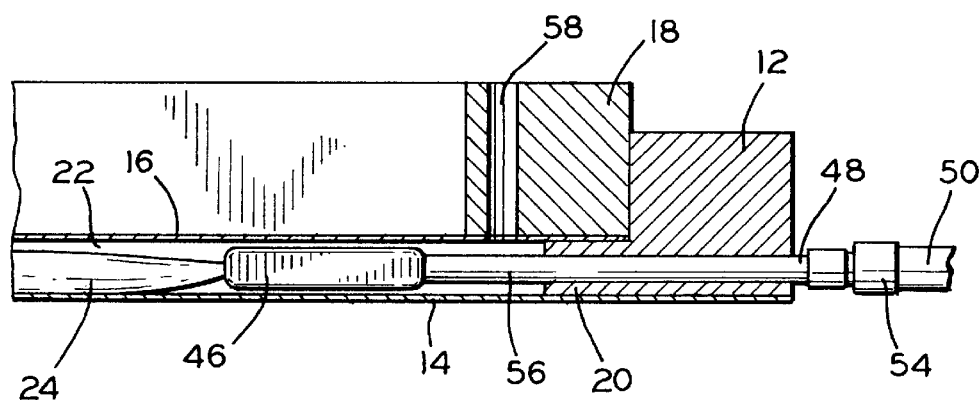
FIG. 8 is a cross section view of a segment of the printing screen assembly showing ink passages in the frames to provide access to the ink dispenser strip.
Figure 9:
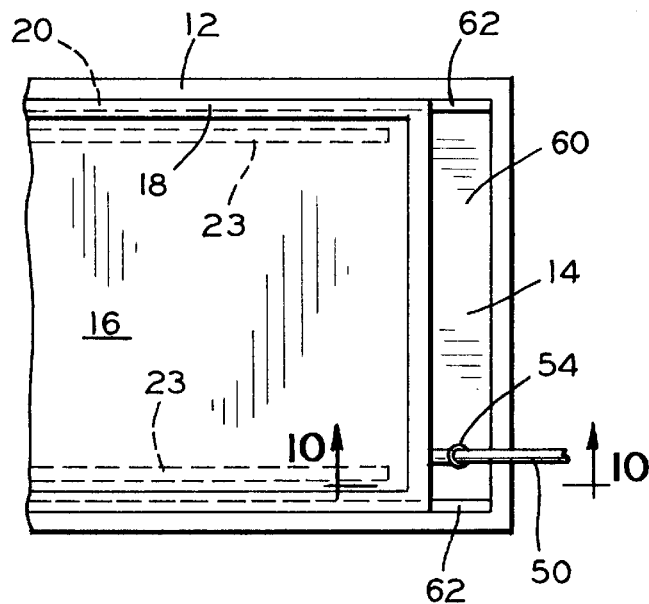
FIG. 9 is a top plan view of an alternative frame configuration with spacers at one end of the frame to provide spacing between the frame members for access to the ink dispenser strip in the containment area, and containment strips mounted in the containment area.
Figure 10:
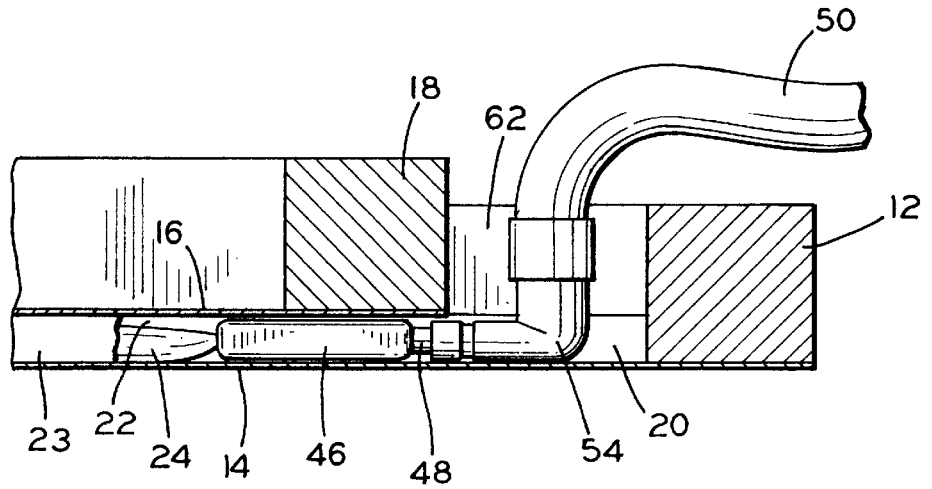
FIG. 10 is a cross sectional view taken along line 10—10 of FIG. 9 showing the frame members and the connection of the ink line to the dispenser strip.

Access to the intake port 48 on strip dispenser 46 can be achieved through an aperture in the shield 16 (FIGS. 6–7), through an aperture in the frame members 12, 18 (FIG. 8), or through a space between outer edge of frame member 18 and the inner edge of frame member 12 (FIGS. 9–10). In FIGS. 6–7, a piece of tape 52 is placed on the shield 16 and a hole is punched or cut in the shield 16. The tape 52 prevents the hole from expanding into an unacceptably larger hole. The intake port 48 extends through the hole in the screen and tape 52, and is connected to a fitting 54 on the end of the supply tube 50. The ink 24 is delivered through the tube 50 and the intake port 48 to the strip dispenser 46.

In FIG. 8, an extension tube 56 extends from the strip dispenser 46 and the intake port 48 is mounted outside of one of the frame members 12 for connection to the fitting 54 on the supply tube 50. FIG. 8 shows the extension tube 56 extending through an aperture drilled in frame member 12. The extension tube 56 could, in the alternative, be positioned through aperture 58 in the frame member 18. Although the taped hole 52 in the shield 16 may be a more economical method for providing access to the containment area, the apertures in the frame members 12, 18 provide a more stable structure for connecting the dispenser 46 to the ink source 38.

In FIGS. 9–10, the outer frame member 12 and the inner frame member 18 are spaced apart at one end to form an elongate aperture 60 to provide access to the containment area 22. An extended spacer 62 extending between the frames 12, 18 can be used to position and secure the frames in the desired relationship. The delivery tube 50 extends into the aperture 60 for connection to an intake port 48 on strip dispenser 46. Once the delivery tube 50 is connected, the aperture 60 could be taped over if contaminants were entering the ink 24 through the aperture 60.

In all of the configurations, the ink 24 is dispensed into the containment area 22 and is moved throughout the containment area 22 by the force of the flood bar 32 on the shield 16. The ink is then forced onto the glass substrate 26 by the action of the squeegee 34 moving across the shield 16. The ink source 38 could also be provided with multiple delivery tubes 50 for delivery to a corresponding number of dispensing strips 46 positioned around the edge of the containment area 22.

Figure 10A:
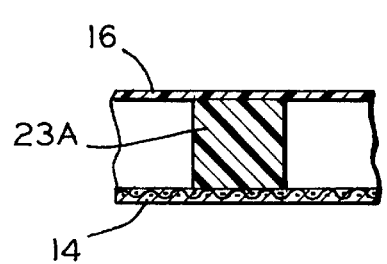
FIGS. 10A–10B are a cross sectional view of alternative embodiments of the container strips.
Figure 10B:
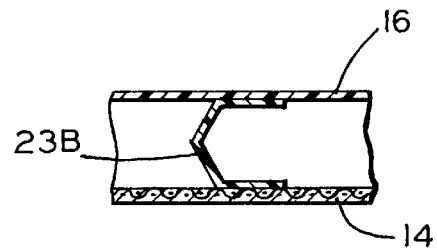

During printing operations, the ink 24 may accumulate in the containment area 22 along the edges of the frame members 12, 18. As shown in FIGS. 9–10, containment strips 23 may be positioned in the containment area 22 and generally parallel to the sides of the frame members 12, 18. As shown in FIGS. 10A–10B, the strips 23 may be made from low density foam 23A or flexible plastic material 23B, and may be secured to the frame members 12, 18 or the screen 14 by tape, glue, or other alternative fastener. The strips 23 are compressible and do not impede the action of the squeegee 34. The containment strips 23 block the movement of the ink 24 such that the ink 24 is maintained in the center of the screen 14.

As noted above, frames 12, 18 are sized for a reasonably tight fit. Clamps could be used around the circumference of the frame members 12, 18 to ensure a stable positioning of the inner frame 18 within the outer frame 12.

Figure 11:
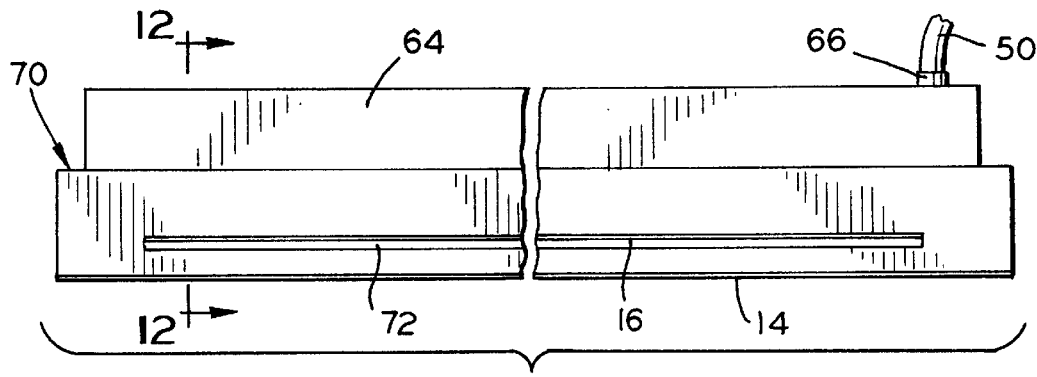
FIG. 11 is a side elevational view of one side of the screen assembly showing a mounting slit cut in the frame member.
Figure 12:
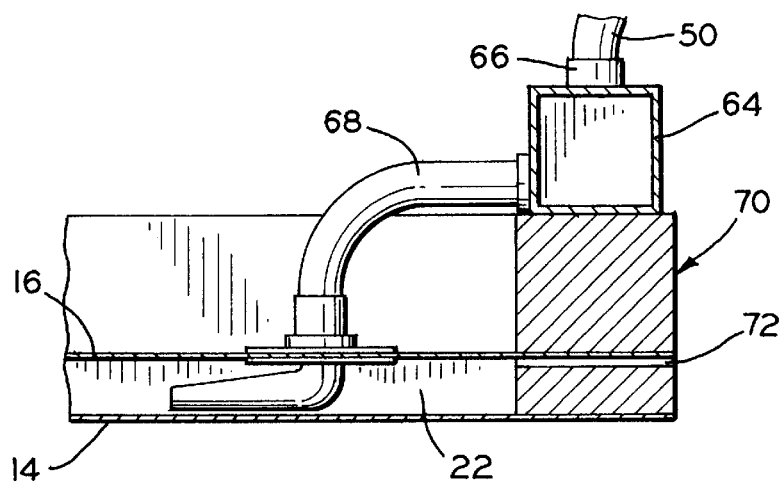
FIG. 12 is a cross sectional view taken along line 12—12 of FIG. 11 showing the mounting of the mesh screen and the shield on a single frame member.

Alternative frame configurations and ink dispensing systems may be used to supply ink 24 to the containment area 22. Alternative dispensers 64 which are too large to fit in the containment area 22 could mounted on the screen assembly 22 to dispense ink 24 into the containment area 22 (FIGS. 11–12). The delivery tube(s) 50 could be connected to intake port(s) 66 on the dispenser 64 positioned on the outer surface of the shield 16 or on the outer surface of a frame member 70. Multiple leads 68 or dispensing ports could be extended through the shield 16 and into the desired location within the containment area 22. The frame 70 is a unitary member having an extended slit 72 formed in the frame 70. The opposing edge of the frame 70 would have a similar slit. The shield 16 extends through the slits 72 and is secured to the frame 70 along with the screen 14. Alternative frame and ink dispensing configurations are acceptable to position the screen 14 and elastic shield 16 in generally parallel, spaced-apart relationship and to deliver sufficient quantities of ink 24 into the containment area 22.

If the ink 24 is a water-based ink, another concern during the printing process is to maintain the proper moisture level in the ink 24 so as to prevent hardening of the ink and clogging of the screen 14. In some cases, merely enclosing the ink 24 in the containment area 22 will provide an acceptable operating condition by preventing the evaporation of moisture from the ink 24. Even in the containment area 22, the ink 24 is exposed to atmospheric conditions such that moisture must be added to the containment area to maintain the ink 24 at the desired relative humidity. A hot and dry atmosphere will often cause problems with water-based inks.

Figure 13:
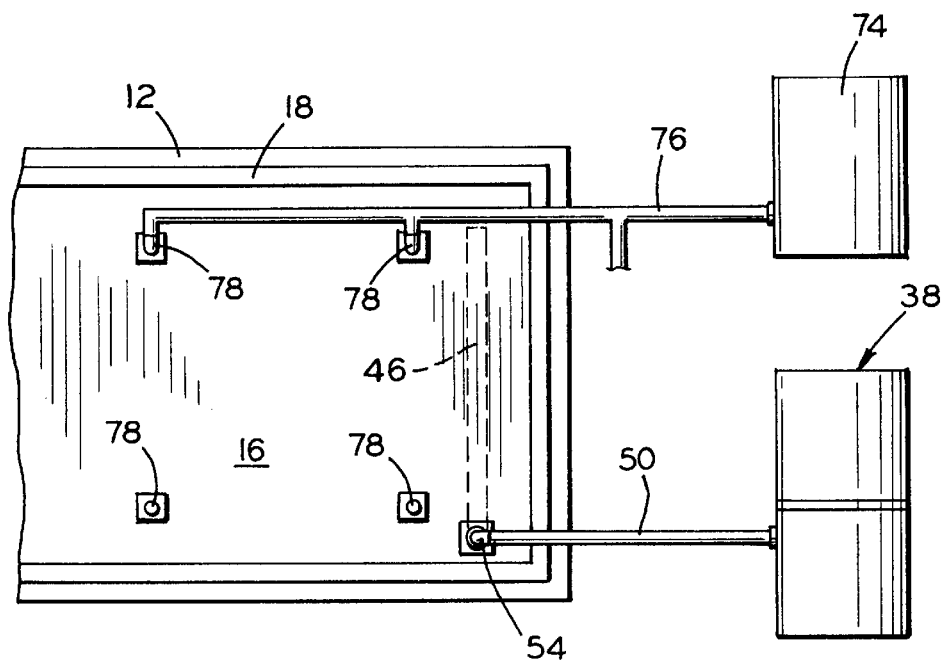
FIG. 13 is a top plan view of a printing screen assembly showing the delivery of both ink and water vapor in an inert gas to the containment area between the shield and the screen.

In order to maintain the desired transfer of a water-based ink 24 through the mesh openings 28 in the screen 14 to the glass substrate 26 in a production operation, the ink 24 may require not only containment in the ink containment area 22, but also the addition of water vapor and or an inert gas into the containment area 22. In general, the relative humidity should be at least 60% with the preferred range for the relative humidity being 80%–100%. In order to maintain the ink 24 in a humid atmosphere without exposing the production operators and equipment to such undesirable humidity, water vapor can be injected into the containment area 22. Water vapor can be delivered directly to the containment area 22 or combined with an inert gas by a humidifier apparatus 74 as shown in FIG. 13. The water vapor is delivered through tubes 76 to ports 78 extending through the shield 16 and into the containment area 22. Various control systems and sensors can be used to control the delivery of the water vapor so as to maintain the ink 24 within the preferred relative humidity range. The use of an inert gas to deliver the water vapor minimizes the chance for any adverse reaction with the ink 24. In some cases, the addition of water vapor into the system will cause problems due to water condensation on the screen 14. Such problems can be minimized by delivering only an inert gas to the containment area 22 to reduce the water evaporation from the ink 24. In the screen assembly 10 of the present invention, contaminants can be kept from the ink 24 and the environment of the ink 24 can be controlled to achieve the desired dispersion of the ink 24 through the screen 14 during production operations.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. A shielded printing screen for use in a screen printing apparatus to print an ink pattern on a substrate, said shielded printing screen comprising:
    a) a first frame member;
    b) a first sheet of mesh fabric mounted on said first frame member;
    c) at least one layer of exposed emulsion formed on said first sheet of mesh fabric to define a pattern of exposed emulsion and open mesh areas in said first sheet;
    d) a second frame member secured to said first frame member;
    e) a second sheet of elastic material mounted on said second frame member and positioned proximate said first mesh fabric in parallel, spaced-apart relationship such that said first and second sheets and said first and second frame members define an ink containment area, said second sheet being non-porous, whereby ink positioned in the ink containment area is shielded from environmental conditions, and being a mesh fabric having at least one continuous layer of exposed emulsion formed on said mesh fabric.

2. The printing screen defined in claim 1, wherein said second sheet of material is an elastic plastic material in a planar configuration with sufficient elasticity to return said sheet to said planar configuration if deformed.

3. The printing screen defined in claim 1, wherein said second sheet of material is neoprene rubber.

4. The printing screen as defined in claim 1, wherein said second frame member is positioned within said first frame member in proximity to said first sheet of mesh fabric, said first frame member including containment spacers formed along inner edges of said first frame member for nesting said second frame member within said first frame member and maintaining said second sheet of material and said first sheet of mesh fabric in a spaced apart relationship.

5. The printing screen defined in claim 4, wherein said first frame member and said second frame member are integrally formed such that said first sheet and said second sheet are positioned in parallel, spaced-apart relationship on a single frame.

6. A shielded printing screen for use in a screen printing apparatus to print an ink pattern on a substrate, said shielded printing screen comprising:
    a) a first frame member;
    b) a first sheet of mesh fabric mounted on said first frame member;
    c) at least one layer of exposed emulsion formed on said first sheet of mesh fabric to define a pattern of exposed emulsion and open mesh areas in said first sheet;
    d) a second frame member secured to said first frame member;
    e) a second sheet of elastic material mounted on said second frame member and positioned proximate said first mesh fabric in parallel, spaced-apart relationship such that said first and second sheets and said first and second frame members define an ink containment area, said second sheet being non-porous, whereby ink positioned in the ink containment area is shielded from environmental conditions; and f) an ink dispensing means positioned along an edge of the containment area between said first sheet and said second sheet, said ink dispensing means including at least one connection means extending through an aperture in the containment area to facilitate the delivery of ink through said ink dispensing means to the containment area.

7. The printing screen defined in claim 6, wherein the aperture in the containment area is defined by one or more apertures defined in said second sheet.

8. The printing screen defined in claim 6, wherein the aperture in the containment area is defined by one or more apertures drilled in said first frame member.

9. The printing screen defined in claim 6, wherein the aperture in the containment area is defined by one or more apertures drilled in said second frame member.

10. The printing screen defined in claim 6, wherein the aperture in the containment area is defined by positioning said first frame member and said second frame member in spaced-apart relationship.

11. The printing screen defined in claim 6, including a vapor dispensing means having at least one port extending through an aperture in the containment area to facilitate the delivery of a water vapor from said vapor dispensing means to the containment area.

12. The printing screen defined in claim 11, wherein the vapor dispensing means includes a plurality of vapor ports positioned along the perimeter of the containment area, said ports being connected to a source of water vapor in an inert gas.

13. A shielded printing screen for use in a screen printing apparatus to print an ink pattern on a substrate, said shielded printing screen comprising:

a) a first frame member;

b) a first sheet of mesh fabric mounted on said first frame member;

c) at least one layer of exposed emulsion defined on said first sheet of mesh fabric to define a pattern of exposed emulsion and open mesh areas in said first sheet;

d) a second frame member secured to said first frame member;

e) a second sheet of elastic material mounted on said second frame member and positioned proximate said first mesh fabric in parallel, spaced-apart relationship such that said first and second sheets and said first and second frame members define an ink containment area, said second sheet being non-porous, whereby ink positioned in the ink containment area is shielded from environmental conditions; and f) a vapor dispensing means having at least one port extending through an aperture in the containment area to facilitate the delivery of a water vapor from said vapor dispensing means to the containment area.

14. A shielded printing screen for use in a screen printing apparatus to print an ink pattern on a substrate, said shielded printing screen comprising:

a) a first frame member;

b) a first sheet of mesh fabric mounted on said first frame member;

c) at least one layer of exposed emulsion defined on said first sheet of mesh fabric to define a pattern of exposed emulsion and open mesh areas in said first sheet;

d) a second frame member secured to said first frame member;

e) a second sheet of elastic material mounted on said second frame member and positioned proximate said first mesh fabric in parallel, spaced-apart relationship such that said first and second sheets and said first and second frame members define an ink containment area, said second sheet being non-porous, whereby ink positioned in the ink containment area is shielded from environmental conditions; and f) at least one containment strip positioned in the ink containment area between the open mesh areas in said first sheet and an edge of the ink containment area.

* * * * *